United States Patent
Wang et al.

(10) Patent No.: US 10,205,112 B2
(45) Date of Patent: Feb. 12, 2019

(54) ORGANIC LIGHT-EMITTING DIODE DISPLAY PANEL AND ORGANIC LIGHT-EMITTING DIODE DISPLAY DEVICE

(71) Applicants: Shanghai Tianma AM-OLED Co., Ltd., Shanghai (CN); Tianma Micro-Electronics Co., Ltd., Shenzhen (CN)

(72) Inventors: Xiangcheng Wang, Shanghai (CN); Jinghua Niu, Shanghai (CN); Wei He, Shanghai (CN); Yuji Hamada, Shanghai (CN); Chen Liu, Shanghai (CN)

(73) Assignees: Shanghai Tianma AM-OLED Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 22 days.

(21) Appl. No.: 15/592,872

(22) Filed: May 11, 2017

(65) Prior Publication Data
US 2017/0250361 A1    Aug. 31, 2017

(30) Foreign Application Priority Data
Nov. 21, 2016 (CN) .......................... 2016 1 1043948

(51) Int. Cl.
H01L 51/50 (2006.01)
H01L 27/32 (2006.01)
(Continued)

(52) U.S. Cl.
CPC ...... *H01L 51/5004* (2013.01); *H01L 27/3218* (2013.01); *H01L 51/0059* (2013.01);
(Continued)

(58) Field of Classification Search
CPC .................................................. H01L 51/5004
(Continued)

(56) References Cited

U.S. PATENT DOCUMENTS

8,338,222 B2 * 12/2012 Kim .................... H01L 27/3211
257/40
9,065,052 B2 * 6/2015 Kim .................... H01L 51/0001
(Continued)

*Primary Examiner* — Caleb E Henry
(74) *Attorney, Agent, or Firm* — Anova Law Group, PLLC (57) ABSTRACT

An organic light-emitting diode (OLED) display panel and an OLED display device are provided. The OLED display panel comprises a first substrate; a first electrode layer including a plurality of first electrodes; a first hole transport layer; a second hole transport layer including a plurality of hole transport units arranged in correspondence with the plurality of first electrodes respectively; a plurality of light-emitting devices disposed on a surface of the second hole transport layer and arranged in correspondence with the plurality of hole transport units respectively, wherein the hole transport units corresponding to the light-emitting devices of at least one color include at least two hole transport materials, and at least one of the at least two hole transport materials in the hole transport units has a higher lowest unoccupied molecular orbital (LUMO) than the corresponding light-emitting devices; an electron transport layer; and a second electrode layer.

20 Claims, 4 Drawing Sheets (51) Int. Cl.
*H01L 51/52* (2006.01)
*H01L 51/00* (2006.01)

(52) U.S. Cl.
CPC ...... *H01L 51/0072* (2013.01); *H01L 51/5016* (2013.01); *H01L 51/5056* (2013.01); *H01L 51/5072* (2013.01); *H01L 51/5096* (2013.01); *H01L 51/5203* (2013.01); *H01L 51/5271* (2013.01)

(58) Field of Classification Search
USPC .......................................................... 257/40
See application file for complete search history.

(56) References Cited

U.S. PATENT DOCUMENTS

| | | | |
|---|---|---|---|
| 9,502,475 B2* | 11/2016 | Lee | H01L 51/5265 |
| 9,692,013 B2* | 6/2017 | Lee | H01L 51/5265 |
| 9,893,124 B2* | 2/2018 | Song | H01L 51/5096 |
| 2011/0248247 A1* | 10/2011 | Matsumoto | C09K 11/06 |
| | | | 257/40 |
| 2012/0097933 A1* | 4/2012 | Ando | H01L 27/3218 |
| | | | 257/40 |
| 2012/0223633 A1* | 9/2012 | Yoshinaga | H01L 27/3211 |
| | | | 313/504 |
| 2015/0311463 A1* | 10/2015 | Park | H01L 51/5004 |
| | | | 257/40 |
| 2015/0340410 A1* | 11/2015 | Hack | H01L 51/5265 |
| | | | 257/40 |
| 2016/0013412 A1 | 1/2016 | Harikrishna et al. | |
| 2016/0126297 A1* | 5/2016 | Kim | H01L 51/5265 |
| | | | 257/40 |
| 2017/0069864 A1* | 3/2017 | Lee | H01L 51/5004 |

\* cited by examiner

ORGANIC LIGHT-EMITTING DIODE DISPLAY PANEL AND ORGANIC LIGHT-EMITTING DIODE DISPLAY DEVICE

CROSS-REFERENCES TO RELATED APPLICATIONS

This application claims priority of Chinese Patent Application No. 201611043948.0, filed on Nov. 21, 2016, the entire contents of which are hereby incorporated by reference.

FIELD OF THE INVENTION

The present disclosure generally relates to the field of organic light-emitting diode (OLED) technology and, more particularly, relates to an OLED display panel and an OLED display device.

BACKGROUND

An organic light-emitting diode (OLED) display panel is a self-luminous display device with an organic thin film as a luminous body, which has the advantages of ultra-thin thickness, high brightness, high luminous efficiency and good shock resistance. In an OLED display panel, each subpixel area is often defined by a pixel definition layer. To improve the package or encapsulation of the subpixel, spacers are provided on the pixel-defining layer between any two adjacent subpixels.

However, in an existing OLED display panel, subpixels adjacent to a subpixel which is turned on may emit undesired light, such that the crosstalk of the OLED display panel may be increased, and the display performance of the OLED display panel may be degraded.

The disclosed OLED display panel and OLED display device thereof are directed to solve one or more problems set forth above and other problems.

BRIEF SUMMARY OF THE DISCLOSURE

One aspect of the present disclosure provides an organic light-emitting diode (OLED) display panel. The organic light-emitting diode (OLED) display panel comprises a first substrate; a first electrode layer disposed on the first substrate and including a plurality of first electrodes; a first hole transport layer disposed on a surface of the first electrode layer far away from the first substrate; a second hole transport layer disposed on a surface of the first hole transport layer far away from the first electrode layer, and including a plurality of hole transport units arranged in correspondence with the plurality of first electrodes respectively; a plurality of light-emitting devices of m number of colors disposed on a surface of the second hole transport layer far away from the first hole transport layer and arranged in correspondence with the plurality of hole transport units respectively, wherein m is a positive integer, the hole transport units corresponding to the light-emitting devices of at least one color include at least two hole transport materials, and at least one of the at least two hole transport materials in the hole transport units has a higher lowest unoccupied molecular orbital (LUMO) than the corresponding light-emitting devices; an electron transport layer; and a second electrode layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined under conditions without conflicts.

Figure 1:
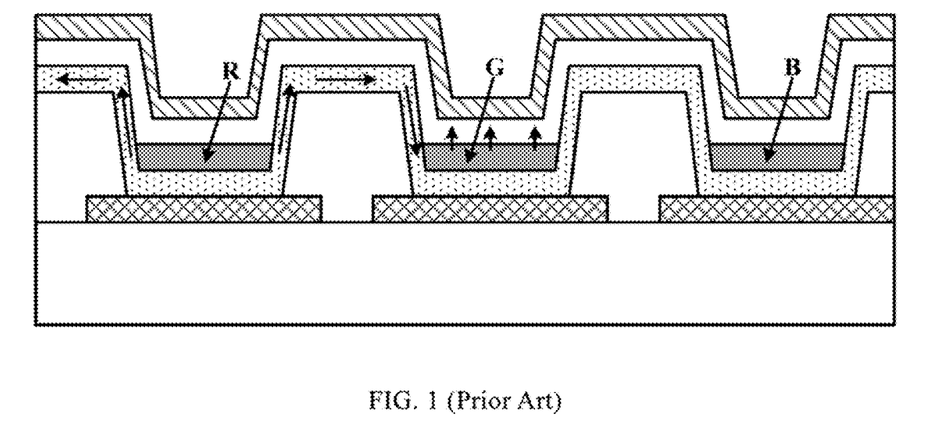
FIG. 1 illustrates a schematic view of an existing organic light-emitting diode (OLED) display.

FIG. 1 illustrates a schematic view of an existing organic light-emitting diode (OLED) display. As shown in FIG. 1, the subpixels of the OLED display panel may be arranged in the order of red subpixel R, green subpixel G and blue subpixel B. When the red subpixel R is intentionally lit or turned on, the carrier in the red subpixel R may drift laterally to the surrounding subpixels, for example, drift laterally to the adjacent green subpixel G. Consequently, the green subpixel G may emit visible green light due to the high luminous efficiency of the green subpixel G.

That is, the green subpixel G may be undesirably lit or may emit undesired light when the red subpixel R is intentionally lit. Accordingly, the red subpixel R may be undesirably lit when the green subpixel G is intentionally lit. The red subpixel R and the green subpixel G may be undesirably lit when B is intentionally lit. As a result, the crosstalk of the OLED display panel may be increased, and the display performance of the OLED display panel may be degraded accordingly.

The present disclosure provides an improved display panel capable of suppressing the undesired light emitted by the adjacent subpixels and, thus, reducing the crosstalk and improving the display performance.

Figure 2:
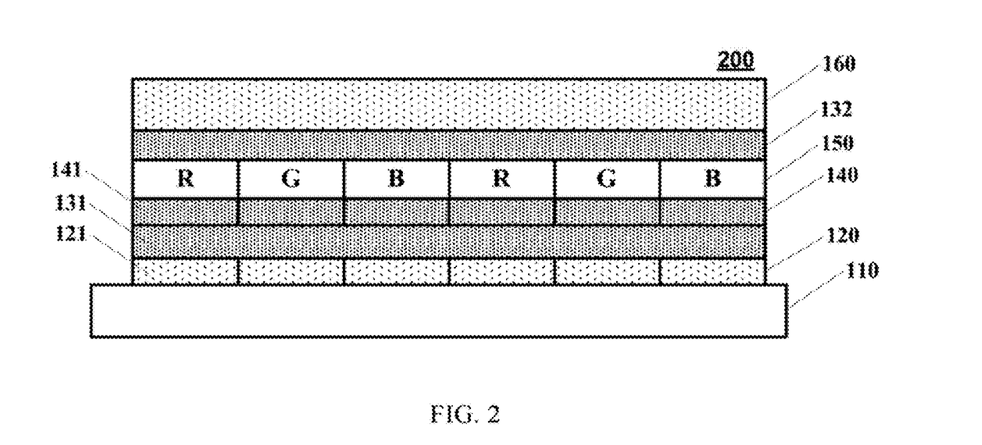
FIG. 2 illustrates a schematic view of an exemplary DEED display panel consistent with disclosed embodiments.

FIG. 2 illustrates a schematic view of an exemplary OLED display panel consistent with disclosed embodiments. As shown in FIG. 2, the OLED display panel 200 may comprise: a first substrate 110, a first electrode layer 120, a first hole transport layer 131, a second hole transport layer 140, a plurality of light-emitting devices 150, an electron transport layer 132, a second electrode layer 160, a plurality of first electrodes 121, and a plurality of hole transport units 141. Other appropriate components may also be included.

In particular, the first electrode layer 120 may be disposed on the first substrate 110, and the first electrode layer 120 may include the plurality of first electrodes 121. The first hole transport layer 131 may be disposed on the surface of the first electrode layer 120 far away from the first substrate 110. The second hole transport layer 140 may be disposed on the surface of the first hole transport layer 131 faraway from the first electrode layer 120, and the second hole transport layer 140 may include the plurality of hole transport units 141. The plurality of hole transport units 141 may be disposed in correspondence with the plurality of first electrodes 121 respectively.

The plurality of light-emitting devices 150 may be disposed on the surface of the second hole transport layer 140 far away from the first hole transport layer 131, and the plurality of light-emitting devices 150 may be disposed in correspondence with the plurality of hole transport units 141 respectively. The plurality of light-emitting devices 150 may include m number of colors, where m is a positive integer. In one embedment, m may be greater than or equal to 3.

The hole transport units 141 corresponding to the light-emitting devices 150 of at least one color may be formed by mixing at least two hole transport materials. In particular, the lowest unoccupied molecular orbital (LUMO) of at least one of the at least two hole transport materials in the hole transport unit 141 may be higher than the lowest unoccupied molecular orbital (LUMO) of the corresponding light-emitting device 150.

The electron transport layer 132 may be disposed on the surface of the plurality of light-emitting devices 150 far away from the second hole transport layer 140. The second electrode layer 160 may be disposed on the surface of the electron transport layer 132 far away from the plurality of light-emitting devices 150.

The first substrate 110 may be made of rigid transparent materials (e.g., glass) or flexible transparent materials (e.g., polyimide). The light-emitting device may include organic light-emitting diode (OLED) devices, quantum dots (QDs) light-emitting devices, or other appropriate light-emitting devices capable of emitting light for displaying videos and/or images.

In one embodiment, as shown in FIG. 2, the first substrate 110 may be a flexible substrate, and the light-emitting device may be an OLED device. That is, the corresponding OLED display panel 200 may be a flexible OLED display panel. The flexible OLED display panel may have characteristics such as low power consumption and good flexibility, and may be applicable to various display devices, such as wearable display devices. The material of the flexible substrate may include polyimide or polyethylene terephthalate resin, which is for illustrative purposes and is not intended to limit the scope of the present disclosure. Any appropriate materials suitable for the flexible substrate fall within the scope of the disclosure.

In another embodiment, the first substrate may be a rigid substrate and, accordingly, a rigid OLED display panel may be provided. The rigid OLED display panel may have broad applications and will not be further described in the present disclosure. In practical applications, the materials of the first substrate may be selected according to various application scenarios.

In the disclosed embodiments, the first electrode layer 120 may be disposed on the first substrate 110, and the first electrode layer 120 may include the plurality of first electrodes 121. According to the structure of the OLED display panel, in one embodiment, as shown in FIG. 2, the first electrode layer 120 may be an anode of the OLED display panel 200. That is, a positive voltage may be applied to the first electrodes 121 of the first electrode layer 120 during electroluminescence.

The first electrode layer 120 may include a high work function material such as indium tin oxide or tin-doped indium oxide (ITO) having a work function as high as approximately 4.5 eV to 5.3 eV, good stability and high transparency. In one embedment, the first electrode 121 may include at least: a reflective film and a transparent conductive film. The reflective film may be disposed on the first substrate 110, and the material of the reflective film may include silver. The transparent conductive film may be disposed on the surface of the reflective film far away from the first substrate 110, and the material of the transparent conductive thin film may include indium tin oxide (ITO), and indium zinc oxide, etc.

The materials and the film configuration of the first electrode layer are for illustrative purposes and are not intended to limit the scope of the present disclosure. The materials of the first electrode layer and the film configuration may be selected according to various application scenarios.

The second electrode layer 160 may be disposed on the surface of the electron transport layer 132 far away from the plurality of light-emitting devices 150. According to the structure of the OLED display panel, in one embodiment, as shown in FIG. 2, the second electrode layer 160 may be a cathode of the OLED display panel 200. That is, a negative voltage is applied to the second electrode layer 160 during electroluminescence.

The second electrode layer 160 may include a low work function material such as Ag, Al, Ca, In, Li, Mg, or low work function composite metal materials. For example, the second electrode layer 160 may include at least one of a magnesium-silver alloy, a silver metal, a silver-ytterbium alloy, and a silver-rare earth metal alloy. The transmittance of the second electrode layer 160 at the wavelength of 550 nm may be greater than or equal to approximately 30%, and smaller than or equal to approximately 60%. The materials of the second electrode layer are for illustrative purposes and are not intended to limit the scope of the present disclosure. The materials of the second electrode layer may be selected according to various application scenarios.

The plurality of light-emitting devices 150 may be disposed on the surface of the second hole transport layer 140 far away from the first hole transport layer 131. The plurality of light-emitting devices 150 may be disposed in correspondence with the plurality of hole transport units 141, respectively. Each light-emitting device 150 may be a subpixel.

In each of the plurality of light-emitting devices 150, when a positive voltage is applied to the first electrode 121 and a negative voltage is applied to the second electrode layer 160, the holes generated by the first electrode 121 as the anode may be injected into the corresponding light-emitting device 150 and, meanwhile, the electrons generated by the second electrode layer 160 as the cathode may also be injected into the corresponding light-emitting devices 150.

The binding of the electrons and holes injected into the light-emitting device 150 may generate excitons. Subsequent radiative transition of the excitons may enable the light-emitting device 150 to emit light.

Further, the light-emitting devices 150 may include m number of colors, wherein m is a positive integer. In one embodiment, m may be greater than or equal to 3. The light-emitting devices 150 of different colors may emit light in different colors. For example, a red light-emitting device may emit red light, which may be considered as a red subpixel.

In the disclosed embodiments, the material of the light-emitting device may include organic small-molecule light-emitting materials or high-molecular-weight polymer light-emitting materials, which are not limited by the present disclosure.

In one embodiment, as shown in FIG. 2, m may be equal to 3, and the light-emitting devices 150 may include a plurality of red light-emitting devices R, a plurality of green light-emitting devices G, and a plurality of blue light-emitting devices B. In another embodiment, m may be equal to 4, and the light-emitting devices may include a plurality of red light-emitting devices, a plurality of green light-emitting devices, and a plurality of blue light-emitting devices, and further a plurality of yellow light-emitting devices or a plurality of white light-emitting devices. The colors and number of the light-emitting devices are for illustrative purposes and are not intended to limit the scope of the present disclosure. In particular application, the colors and number of the light-emitting devices may vary according to various application scenarios.

For better explanation of the technical solutions provided the disclosed embodiments, an OLED display panel in which the light-emitting devices are arranged in specific colors will be described as an example. For example, in one embodiment, as shown in FIG. 2, the plurality of light-emitting devices 150 may be arranged in a row direction and a column direction. That is, tire plurality of light-emitting devices 150 may be arranged in a matrix. Given m=3, in a row of tire light-emitting devices 150, i.e., in a light-emitting device row, the light-emitting devices 150 may be arranged by the colors of red (R), green (G), blue (B), red (R), green (G), blue (B). Every three light-emitting devices 150 in a same row may constitute one pixel.

In certain embodiments, the order of color arrangement of any two adjacent rows of light-emitting devices (i.e., any two adjacent light-emitting device rows) may be different. For example, the first row of light-emitting devices may be arranged in an order of R, G, B, R, G and B, and the second row of light-emitting devices may be arranged in an order of B, R, G, B, R and G, which are for illustrative purposes and are not intended to limit the scope of the present disclosure. In practical applications, the color arranging order of the light-emitting devices may vary according to various application scenarios.

To improve the luminous efficiency of the light-emitting devices 150, in the disclosed embodiments, the OLED display panel 200 may further include the first hole transport layer 131 and the electron transport layer 132. The first hole transport layer 131 may be dispose on the surface of the first electrode layer 120 far away from the first substrate 110. The electron transport layer 132 may be disposed on the surface of the plurality of light-emitting devices 150 far away from the second hole transport layer 140.

The first hole transport layer 131 may enhance the capability of the anode to inject and transport holes into the light-emitting devices 150. The electron transport layer 132 may be disposed between the light-emitting devices 150 and the second electrode layer 160, to enhance the capability of the cathode to inject and transport electrons to the light-emitting devices 150. Thus, more holes and electrons may be injected into the light-emitting devices 150, thereby improving the recombination efficiency of excitons and the luminous efficiency of the light-emitting devices 150.

In the disclosed embodiments, the OLED display panel 200 may further include the second hole transport layer 140, which may be disposed on the surface of the first hole transport layer 131 far away from the first electrode layer 120. The second hole transport layer 140 may include a plurality of hole transport units 141. The plurality of hole transport units 141 may be disposed in correspondence with the plurality of first electrodes 121 respectively.

The plurality of hole transport units 141 of the second hole transport layer 140 may be independent from each other, and may also be disposed in correspondence with the plurality of light-emitting devices 150 respectively. That is, each light-emitting device 150 may correspond to an independent hole transport unit 141. The hole transport units 141 may enhance the capability of the anode to inject and transport holes and, thus, increase the number of the holes injected to the light-emitting devices 150.

Those skilled in the art would understand that the structures described and illustrated in the disclosed embodiments are only partial structures of as OLED display panel. An OLED display panel also includes other structures such as a glass cover plate and etc., which are not specifically described in the present disclosure.

As discussed above, in one embodiment, as shown in FIG. 2, the OLED display panel 200 may include both the first hole transport layer 131 and the second hole transport layer 140. In another embodiment, the OLED display panel may only include the second hole transport layer. That is, the hole transport layer may not include the first hole transport layer. A corresponding structure is shown in FIG. 3.

Figure 3:
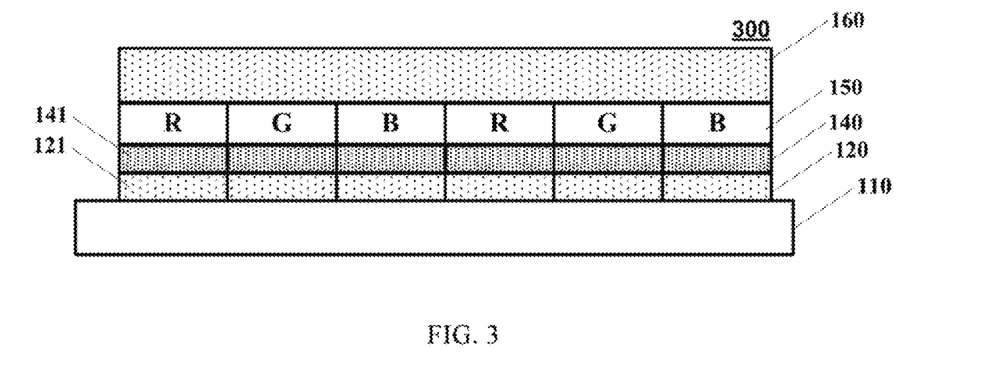
FIG. 3 illustrates a schematic view of another exemplary OLED display panel consistent with disclosed embodiments.

FIG. 3 illustrates a schematic view of another exemplary OLED display panel consistent with disclosed embodiments. The similarities between FIG. 3 and FIG. 2 are not repeated here, while certain differences may be explained. As shown in FIG. 3, different from the OLED display panel 200 shown in FIG. 2, the OLED display panel 300 shown in FIG. 3 may only include the second hole transport layer 140 instead of both the first hole transport layer and the second hole transport layer. Compared to the OLED display panel in FIG. 2, the OLED display panel in FIG. 3 may be lighter and thinner.

As discussed in the background, in an existing OLED display panel, undesired light may be emitted by subpixels adjacent to turned-on subpixels. For example, in an existing OLED panel in which red subpixels R, green subpixels G and blue subpixels are alternately arranged, to intentionally turn on the red subpixel R, a positive voltage may be applied to the anode of the red subpixel R and a negative voltage may be applied to the cathode. The holes may be injected from the anode and the electrons may be injected from the cathode into the red subpixel R. In the red subpixel R, excitons formed by the binding of the injected electrons and holes may enable the red subpixel R to emit red light by electroluminescence.

However, some of the carriers injected into the red subpixel R may drift laterally to the neighboring subpixels through the hole-transport layer, for example, to the adjacent green subpixel G, then the excitons formed by the binding of the injected electrons and holes in the green subpixel G may enable the subpixel G to emit green light by electroluminescence. Similarly, the red subpixels R may emit undesired light when the green subpixels G are turned on. The red subpixels R and the green subpixels G may emit undesired light when the blue subpixels B are turned on.

That is, in the existing OLED display panel, when one subpixel is turned on, some of the carriers in the turned-on subpixel may laterally drift to the adjacent subpixels through the hole transport layer, causing the adjacent subpixels to emit undesired light and increase the crosstalk.

To solve one or more problems set forth above, in the disclosed embodiments, the light-emitting devices of different colors may be provided with corresponding hole transport units that are independent from each other. Furthermore, the hole transport units 141 corresponding to light-emitting devices 150 of at least one color may be formed by mixing at least two hole transport materials. At least one of the at least two hole transport materials may have the lowest unoccupied molecular orbital (LUMO) higher than the lowest unoccupied molecular orbital (LUMO) of the corresponding light-emitting devices 150, thereby suppressing the undesired light.

The mobility of one hole transport material is often fixed. Thus, when the hole transport unit 141 is formed of only one hole transport material, the parameters of the hole transport unit, such as mobility, may not be adjusted. However, when the hole transport unit 141 is formed by mixing at least two hole transport materials, through selecting two hole transport materials and adjusting the mass ratio of the two hole transport materials according to various application scenarios, the parameters of the hole transport unit 141 such as carrier mobility may be adjusted, even the light-emitting center of the light-emitting device 150 may also be adjusted to an optimum position to optimize the brightness of the light-emitting device 150.

When the hole transport unit 141 has a desired mobility, the hole transport unit 141 may be able to realize a substantially low light-emitting voltage of the corresponding light-emitting device 150, and reduce the lateral drift velocity of the hole in the hole transport units 141. That is, the lateral current of the hole may be reduced, and the undesired light emitted from the light-emitting devices adjacent to turned-on light-emitting devices may be suppressed.

In the disclosed embodiments, the hole transport units 141 corresponding to the light-emitting devices 150 of at least one color may be formed by mixing at least two hole transport materials, in which at least one of the at least two hole transport materials may have the lowest unoccupied molecular orbital (LUMO) higher than the corresponding light-emitting devices 150. Thus, the electrons from the light-emitting device 150 may be prevented to be injected into the corresponding hole transport unit 141.

That is, the hole transport unit 141 may prevent the electrons in the corresponding light-emitting device 150 from flowing outside the light-emitting device 150 and injecting into the hole transport unit 141. Thus, the leakage current of the light-emitting device 150 may be suppressed, i.e. a negative current leading to a reduced lifetime may also be suppressed in the OLED display panel. Meanwhile, the electrons in the light-emitting device 150 may be prevented from leaking and recombining with the holes in the hole transport unit 141. Thus, the hole injection rate may substantially remain the same, and the number of the holes injected into the light-emitting device 150 may be maintained to improve the luminous efficiency of the light-emitting device 150.

When the electrons leaked or drilled from the light-emitting device 150 are recombined with the holes in the hole transport unit 141, the recombination may lead to heat dissipation, which may result in a substantially high temperature in the OLED display panel, the material deterioration, and the decreased lifetime.

The hole transport units 141 in the disclosed OLED display panels may be able to block the electrons form the corresponding light-emitting device 150. That is, the hole transport units 141 in the disclosed OLED display panels may be able to prevent the electrons in the corresponding light-emitting device 150 from flowing outside the light-emitting device 150 and injecting into the hole transport unit 141, thereby enhancing the performance of the OLED display panel.

In one embodiment, the hole transport units 141 corresponding to light-emitting devices 150 of at least one color may be formed by mixing at least two hole transport materials, in which the triplet energy level of at least one of the two hole transport materials may be higher than the triplet energy level of the corresponding light-emitting devices 150.

When the triplet energy level of the hole transport unit 141 is higher than the triplet level of the corresponding light-emitting device 150, the hole transport unit 141 may block the luminescent excitons from being injected into the hole transport unit 141. That is, the luminescent excitons formed by the binding of the electron and holes may be confined within the light-emitting device 150 to a void the leakage of the luminescent excitons, thereby improving the luminous efficiency of the light-emitting device 150.

In the disclosed embodiments, the hole transport units 141 corresponding to the light-emitting devices 150 of different colors may be formed by a fine metal mask (FMM) evaporation process. For example, for the OLED display panel including the red, green and blue light-emitting devices, six fine metal mask FMM evaporation processes may be adopted to successively form the independent hole transport units corresponding to the red light-emitting devices R, the independent hole transport units corresponding to the green light-emitting devices G, the independent hole transport units corresponding to the blue light-emitting device B, the red light-emitting devices R, the green light-emitting devices G, and the blue light-emitting devices B. The evaporation process flow is for illustrative purposes and is not intended to limit the scope of the present disclosure. The evaporation process flow may be selected according to various application scenarios.

In the disclosed embodiments, the plurality of light-emitting devices of the OLED display panel may be disposed in correspondence with the plurality of hole transport units respectively. The hole transport units corresponding to the light-emitting devices of at least one color may be formed by mixing at least two the hole transport materials, in which the lowest unoccupied molecular orbital (LUMO) of at least one of the at least two hole transport material may be higher than the lowest unoccupied molecular orbital (LUMO) of the corresponding light-emitting devices 150.

Thus, the hole transport units formed by mixing the at least two hole transport materials may be able to reduce the lateral drift velocity of the holes and the lateral current of the holes, thereby suppressing the undesired light emitted from the adjacent light-emitting devices.

Further, the hole transport units formed by mixing the at least two hole transport materials may be able to prevent the electrons in the corresponding light-emitting devices from flowing out and injecting into the hole transport units, to suppress the leakage current in the light-emitting devices and the negative current that can lead to a reduced lifetime of the OLED display panel. Thus, the hole injection rate may substantially remain the same and the luminous efficiency of the light-emitting devices may be maintained.

In addition, the electrons leaked from the light-emitting device may be suppressed from being recombined with the holes in the hole transport unit, which may suppress the heat dissipation due to the recombination and, according, prevent a substantially high temperature in the OLED display panel. Thus, the material and lifetime degradation may be suppressed.

In one embodiment, the hole transport material corresponding to the hole transport unit 141 may include at least one of triphenylamine-containing compounds and carbazole-containing compounds. When the hole transport unit is formed of one hole transport material, the hole transport material of the hole transport unit may include any one of triphenylamine-containing compounds and carbazole-containing compounds. When the hole transport unit 141 is formed by mixing two hole transport materials, the hole transport material of the bole transport unit may include two triphenylamine-containing compounds, two carbazole-containing compounds, or one triphenylamine-containing compound and one carbazole-containing compound.

The triphenylamine-containing compounds and carbazole-containing compounds may be adopted as the hole transport materials, due to the low ionization energy and strong electron-donating ability, as well as the hole transport characteristics during constant electron-donating process. The potential barrier at the interface between the anode and the triphenylamine-containing compounds, as well as the potential barrier at the interface between the anode and carbazole-containing compounds, may be substantially low, thereby facilitating the injection and transport of holes. The triphenylamine-containing compounds and carbazole-containing compounds may also have good thermal stability to maintain a stable structure of the OLED display device and suppress the performance degradation.

The hole transport materials may include triphenylamine-containing compounds and carbazole-containing compounds, which are for illustrative purposes and are not intended to limit the scope of the present disclosure. The hole transport materials may be selected according to various application scenarios.

Further, the thickness of the hole transport unit 141 may vary according to various application scenarios. In one embodiment, the thickness of the hole transport unit 141 (R-prime) corresponding to the red light-emitting device R may be greater than or equal to approximately 700 Å and smaller than or equal to approximately 1100 Å. The thickness of the hole transport unit 141 (G-prime) corresponding to the green light-emitting device G may be greater than or equal to approximately 400 Å and smaller than or equal to approximately 600 Å. The thickness of the hole transport unit 141 (B-prime) corresponding to the blue light-emitting device B may be greater than or equal to approximately 100 Å and smaller than or equal to approximately 300 Å.

The OLED display panel may have a microcavity effect. For example, in a top emitting OLED display panel, when the light is emitted toward the top, some light may emit toward the bottom and then be reflected at the anode. Interference between the reflected light and light emitted toward the top may occur. The hole transport layer of she OLED display panel may be able to adjust the interference effect, and enhance the luminous effect and the brightness by controlling the optical path. That is, the hole transport layer may not only improve the hole injection and transport capability, but also perform an optical adjustment on the microcavity effect in the OLED display panel.

The thickness of the R-prime may be adjusted, such that the microcavity effect of the red light emitted by the red light-emitting device R may be adjusted and, accordingly, the luminous efficiency of the red light may be improved. When the thickness of the R-prime is smaller than approximately 700 Å or greater than approximately 1100 Å, the luminous efficiency of the red light may be substantially low. When the thickness of R-prime is between approximately 700 Å and approximately 1100 Å, the luminous efficiency of the red light may be substantially high.

The thickness of the G-prime may be adjusted, such that the microcavity effect of the green light emitted by the green light-emitting device G may be adjusted and, accordingly, the luminous efficiency of the green light may be improved. When the thickness of the G-prime is smaller than approximately 400 Å or greater than approximately 600 Å, the luminous efficiency of the green light may be substantially low. When the thickness of G-prime is between approximately 400 Å and approximately 600 Å, the luminous efficiency of the green light may be substantially high.

Similarly, the thickness of the B-prime may be adjusted, such that the microcavity effect of the blue light emitted by the blue light-emitting device B may be adjusted and, accordingly, the luminous efficiency of the blue light may be improved. When the thickness of the B-prime is smaller than approximately 100 Å or higher than approximately 300 Å, the luminous efficiency of the blue light may be substantially low. When the thickness of the B-prime is between approximately 100 Å and approximately 300 Å, the luminous efficiency of the blue light may be substantially high.

In one embodiment, as shown in FIG. 2, the first hole transport layer 131 may include at least one composite material layer formed by a hole transport material or a mixture of a plurality of hole transport materials. The first hole transport layer 131 may be formed by at least one hole transport material, to improve the hole injection and transport capability and, thus, improve the luminous efficiency of light-emitting devices 150 of different colors. The first hole transport layer 131 may be a common hole transport layer, and the thickness of the first hole transport layer 131 may be the same in the regions corresponding to the plurality of light-emitting devices 150. That is, the first hole transport layer 131 in the OLED display panel may have a same thickness over the entire film layer. In one embodiment, the thickness of the first hole transport layer 131 may be greater than or equal to approximately 800 Å, and smaller than or equal to approximately 1300 Å.

When the thickness of the first hole transport layer 131 is substantially small (e.g., smaller than approximately 800 Å), the thickness of the hole transport units 141 may have to be increased, such that the first hole transport layer 131 and the second hole transport layer 140 may provide a uniform and good optical adjustment on the blue light-emitting device B, the red light-emitting device R, and the green light-emitting device G. Because the B-prime has a lower mobility than the R-prime and the G-prime, when the thickness of the B-prime is increased, the threshold voltage of the blue light-emitting device B may become substantially high, which may reduce the luminous efficiency and lifetime of the blue light-emitting device B.

When the thickness of the first hole transport layer 131 is substantially large (e.g., greater than approximately 1300 Å, the thickness of the hole transport units 141 may have to be reduced, such that the first hole transport layer 131 and the second hole transport layer 140 may provide a uniform and good optical adjustment on the blue light-emitting device B, the red light-emitting device R, and the green light-emitting device G. Because the blue light-emitting device B often has a lower luminous efficiency than the red light-emitting device R and the green light-emitting device G, the B-prime may desire a thinner thickness than R-prime and G-prime.

When the thickness of the hole transport unit 141 in the second hole transport layer 140 is reduced, the thickness of the B-prime corresponding to the blue light-emitting device B may be substantially thin. When the thickness of the hole transport unit 141 corresponding to the blue light-emitting device B is substantially thin, the B-prime may be unable to improve the luminous efficiency and lifetime of the blue light-emitting device B, leading to the substantially low luminous efficiency and substantially short lifetime of the blue light-emitting device B.

Thus, to improve the luminous efficiency and lifetime of the blue light-emitting device B, the thickness of the first hole transport layer 131 may have to be controlled in a desired range. In one embodiment, When the thickness of the first hole transport layer 131 is greater than or equal to approximately 800 Å, and smaller than or equal to approximately 1300 Å, the first hole transport layer 131 may not only optically adjust the microcavity effect of the OLED display panel but also increase the luminous efficiency and lifetime of the blue light-emitting device B.

When manufacturing the OLED display panel, the thickness of the first hole transport layer 131 may be determined first, then according to the effect of the optical adjustment, the thickness of the hole transport unit 141 corresponding to each light-emitting device 150 of different colors may be determined.

In one embodiment, the electron transport layer 132 may be formed by doping at least one electron transport material with at least one metal compound. The metal compound and the electron transport material may both include organic compounds. When the two organic compounds are mixed to form the electron transport layer 132, the lifetime of the electron transport layer 132 may be effectively increased. The metal compound may include at least one of alkaline earth metal compounds, alkali metal compounds and rare earth metal compounds.

In another embodiment, the electron transport layer 132 may be formed by doping at least one electron transport material with at least one metal. The metal may include at least one of alkaline earth metals, alkali metals and rare earth metals. The electron transport material may include at least one organic compound. When the organic compound is doped with the metal to form the electron transport layer 132, the mobility of the electron transport material may be improved. Thus, the electron injection and transport capability may be improved and, accordingly, the threshold voltage of the light-emitting devices 150 may be reduced and the luminous efficiency of the light-emitting devices 150 may be improved.

In one embodiment, the thickness of the electron transport layer 132 may be greater than or equal to approximately 250 Å and smaller than or equal to approximately 350 Å. When the thickness of the electron transport layer 132 is greater than approximately 350 Å, the mobility of the electron transport layer 132 may be reduced, leading to a high threshold voltage of the light-emitting device 150. When the thickness of the electron transport layer 132 is less than approximately 250 Å, the lifetime of the electron transport layer 132 may be reduced.

In one embodiment, the red light-emitting device R may be formed by doping at least one first host material with a first guest material. The mass ratio of the first guest material to the at least one first host, material may be greater than or equal to approximately 1% and less than or equal to approximately 10%. The green light-emitting device G may be formed by doping at least one second host material with a second guest material. The mass ratio of the second guest material to the at least one second host material may be greater than or equal to approximately 5% and less than or equal to approximately 15%. The blue light-emitting device B may be formed by doping at least one third host material with a third guest material. The mass ratio of the third guest material to the at least one third host material may be greater than or equal to approximately 1% and less than or equal to approximately 5%.

When the mass ratio of the first guest material to the at least one first host material is great than approximately 10% for the red light-emitting device R, the exciton concentration may be substantially high, and the collision among the excitons may occur, leading to a low luminous efficiency and a short lifetime. When the mass ratio of the first guest material to the at least one first host material is less than approximately 1%, the excitons may not be sufficiently recombined, leading to a low luminous efficiency and a short lifetime of the light-emitting device. Other light-emitting devices 150 may be similar to the red light-emitting device R. When the mass ratio of the guest material and the host material is too high or too low, low the luminous efficiency may be substantially low and the lifetime of the light-emitting devices may be reduced.

When the light-emitting device 150 of any color includes at least two host materials, the at least two host materials may be able to further adjust the mobility of holes and electrons in the light-emitting device 150, control the exciton recombination efficiency, and improve the luminous efficiency and lifetime of the light-emitting device.

In certain embodiments, the first host material and the second host material may each include carbazole-containing compounds. The first guest material and the second guest material may each include phosphorescent materials. The third host material may include aromatic compounds. The third guest material may include fluorescent materials. The red phosphorescent materials adopted by the red light-emitting device R and the green phosphorescent materials adopted by the green light-emitting device may lead to high luminous efficiency and long lifetime which meet the commercial requirements. The blue fluorescent material adopted by the blue light-emitting device B may lead to a desired long lifetime to meet the commercial requirements. As a comparison, the lifetime of the blue phosphorescent material may be substantially short to meet the commercial requirements.

The carbazole-containing compounds may have a high triplet energy, and may also have hole transport and electron transport properties. The carbazole-containing compounds may have substantially large triplet energy and carrier transport properties and, thus, may be adopted as the host materials. The aromatic compounds may have a large conjugated plane, and may also have a relatively strong electron accepting capability and electron transport properties, but may not form a complex with luminescent materials.

Those skilled in the art would understand that a variety of carbazole-containing compounds may be used as the host material of the red light-emitting unit, and a variety of carbazole-containing compounds may be used as the host material of the green light-emitting unit, and a variety of aromatic compounds may be used as the host material of the blue light-emitting unit, which are not limited by the present disclosure.

If should be noted that, the red light-emitting device R, the green light-emitting device G, and the blue light-emitting device B may have large difference in the external quantum efficiencies. In particular, given a current density of 10 mA/cm$^2$, the external quantum efficiency of the red light-emitting device R may be greater than or equal to approximately 18%, the external quantum efficiency of the green light-emitting device G may be greater than or equal to approximately 18%, and the external quantum efficiency of the blue light-emitting device B may be greater than or equal to approximately 10%.

External quantum efficiency is explained as follows. When the photons are incident onto the surface of a photosensitive device, some of the photons will stimulate the photosensitive material to produce electron-hole pairs to create a current, in which the ratio between the number of the generated electrons and the number of all the incident photon is the external quantum efficiency.

Higher external quantum efficiency may indicate a higher brightness of the light-emitting device. The undesired light emitted by the light-emitting devices adjacent to the turned-on light-emitting device in an existing OLED display panel as discussed in the background, may be related to the high brightness of the light-emitting devices. Because the external quantum efficiencies of the red light-emitting device R and the green light-emitting device G are substantially high, undesired light may be emitted by the red light-emitting device R and the green light-emitting device G.

In the disclosed embodiments, the undesired light emitted by the light-emitting devices adjacent to the turned-on light-emitting device may be suppressed by adopting the plurality of hole transport units that are independent from each other. Those skilled in the art would understand that the plurality of hole transport units that are independent from each other may be able to suppress the undesired light emitted by the light-emitting devices adjacent to the turned-on light-emitting device in any OLED display panels, not only limited to the OLED display panels in which the undesired light emitted by the light-emitting devices is caused by high external quantum efficiency.

The hole transport units 141 corresponding to the light-emitting devices 150 of at least one color may be formed by mixing at least two hole transport materials. In particular, the lowest unoccupied molecular orbital (LUMO) of at least one of the at least two hole transport materials may be higher than the lowest unoccupied molecular orbital (LUMO) of the corresponding light-emitting devices 150, and the triplet energy level of at least one of the at least two hole transport materials may be higher than the triplet energy level of the corresponding light-emitting devices 150.

In one embodiment, the thickness of the red light-emitting device R and the green light-emitting device G may be greater than or equal to approximately 200 Å and less than or equal to approximately 400 Å. The thickness of the blue light-emitting device B may be greater than or equal to approximately 150 Å and less than or equal to approximately 350 Å. When the thickness of the red light-emitting device R is more than approximately 400 Å, the threshold voltage of the red light-emitting device R may be substantially high. When the thickness of the red light-emitting device R is less than approximately 200 Å, the excitons of the red light-emitting device 150 may not be sufficiently recombined, leading to a low luminous efficiency and a short lifetime.

Other light-emitting devices 150 may be similar to the red light-emitting device R. When the thickness of any light-emitting device of any color is greater than the corresponding upper limit thickness value, the threshold voltage of the light-emitting device may be too high. When the thickness of any light-emitting device of any color is smaller than the corresponding lower limit thickness value, excitons may not be sufficiently recombined, leading to low luminous efficiency and short lifetime of the light-emitting device.

Figure 4:
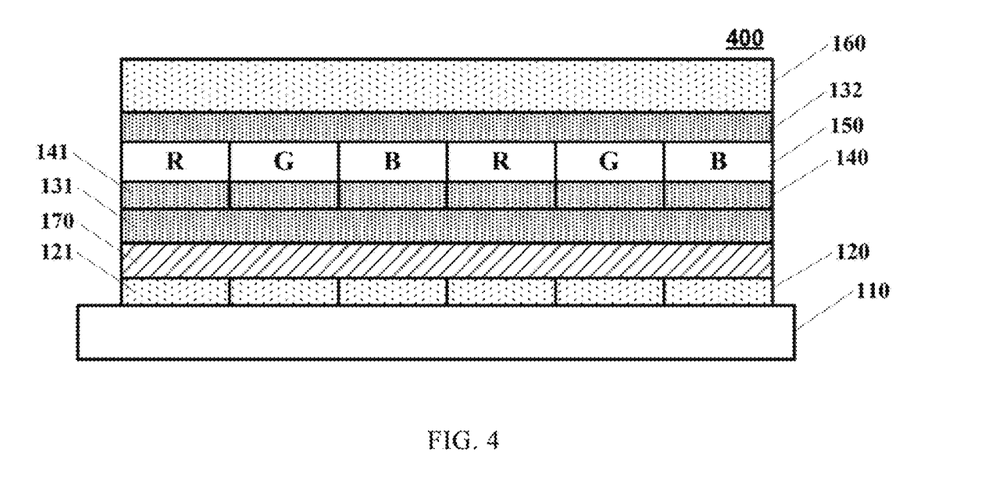
FIG. 4 illustrates a schematic view of another exemplary OLED display panel consistent with disclosed embodiments.

FIG. 4 illustrates a schematic view of another exemplary OLED display panel consistent with disclosed embodiments. The similarities between FIG. 4 and FIG. 2 are not repeated here, while certain differences may be explained. As shown in FIG. 4, different from the OLED display panel 200 in FIG. 2, the OLED display panel 400 in FIG. 4 may further include buffer layer 170.

In particular, to reduce the potential barrier between the first electrode layer 120 and the first hole transport layer 131, and facilitate the hole transition from the first electrode layer 120 to the first hole transport layer 131, the buffer layer 170 may be disposed between the first electrode layer 120 and the first hole transport layer 131.

The thickness of the buffer layer 170 may be greater than or equal to approximately 50 Å and smaller than or equal to approximately 100 Å. Because the buffer layer 170 has a high mobility, when the thickness of the buffer layer 170 increases the lateral resistance of the buffer layer 170 may reduce, and the lateral current of the buffer layer 170 may increases. For the high mobility of the buffer layer 170, when the thickness of the buffer layer 170 is greater than approximately 100 Å, the undesired light may be easily emitted from the adjacent light-emitting devices.

When the thickness of the buffer layer 170 is too small, for example, smaller than approximately 50 Å, the buffer layer 170 formed on the first electrode layer 120 by the buffer material may tend to be discontinuous, hindering the hole injection into the hole transport layer, leading to low luminous efficiency and short lifetime of the light-emitting devices 150. The first electrode layer 120 is often not flat, when the thickness of the buffer layer 170 is too small, the first electrode layer 120 may not be entirely covered, a device failure may occur.

The buffer layer 170 may be formed by doping hole transport materials with p-type dopants, in which the mass ratio of the p-type dopant to the hole transport material may be great than or equal so approximately 0.5% and less than or equal to approximately 10%. Accordingly, the hole injection and transport capability may be improved, the potential barrier for the transition of holes from the first electrode layer 120 to the hole transport layer may be reduced, and the threshold voltage of the light-emitting device 150 may be prevented from going excessively high.

When the mass ratio of the p-type dopant to the hole transport material is too high, for example, great than approximately 10%, the mobility of the buffer layer 170 may be substantially high, reducing the lifetime of the light-emitting devices. When the mass ratio of the p-type dopant to the hole transport material is too low, for example, less than or equal to approximately 10%, the mobility of the buffer layer 170 may be substantially low, increasing the threshold voltage of the light-emitting devices 150.

Figure 5:
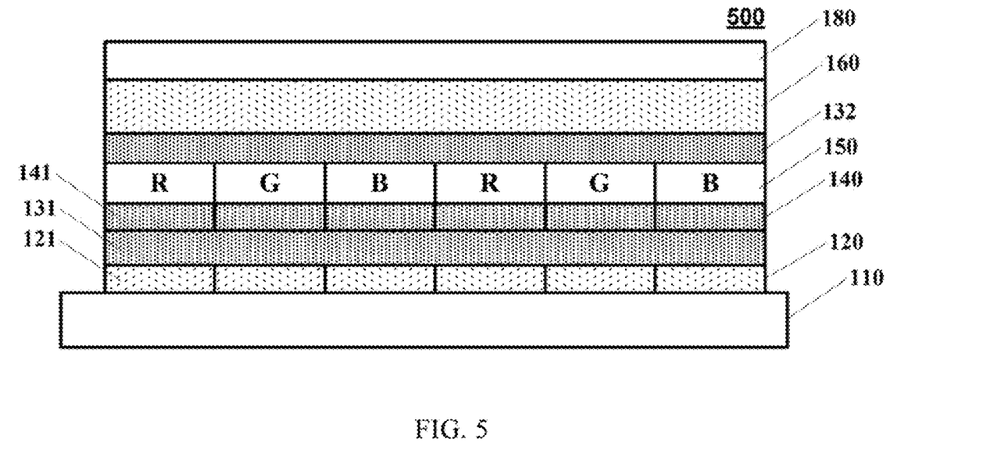
FIG. 5 illustrates a schematic view of another exemplary OLED display panel consistent with disclosed embodiments.

FIG. 5 illustrates a schematic view of another exemplary OLED display panel consistent with disclosed embodiments. The similarities between FIG. 5 and FIG. 2 are not repeated here, while certain differences may be explained. As shown in FIG. 5, different from the OLED display panel 200 in FIG. 2, the OLED display panel 500 in FIG. 5 may further include a capping layer 180.

In particular, the capping layer 180 may be disposed on the surface of the second electrode 160 far away from the electron transport layer 132. In one embodiment, the thickness of the capping layer 180 may be greater than or equal to approximately 500 Å and smaller than or equal to approximately 800 Å, and the retractive index of the capping layer 180 may be greater than approximately 1.8 at the wavelength of 500 nm.

The capping layer 180 may prevent the outgoing light (i.e., the light emitted from the light-emitting devices) from being reflected, such that the display performance of the OLED display panel may not be affected by the reflection of the outgoing light. When the refractive index of the capping layer 180 is too low, for example, lower than approximately 1.8, the luminous efficiency of the light-emitting device 150 may be low. When the refractive index of the capping layer 180 is greater than approximately 1.8 at the wavelength of 500 nm, the capping layer 180 may be able to extract the light from the cathode and improve the luminous efficiency of the light-emitting device 150.

To improve the outgoing efficiency of light and the display performance of the OLED display panel, one embodiment, the thickness of the capping layer 180 may be greater than or equal to approximately 500 Å and smaller than or equal to approximately 800 Å.

Figure 6:
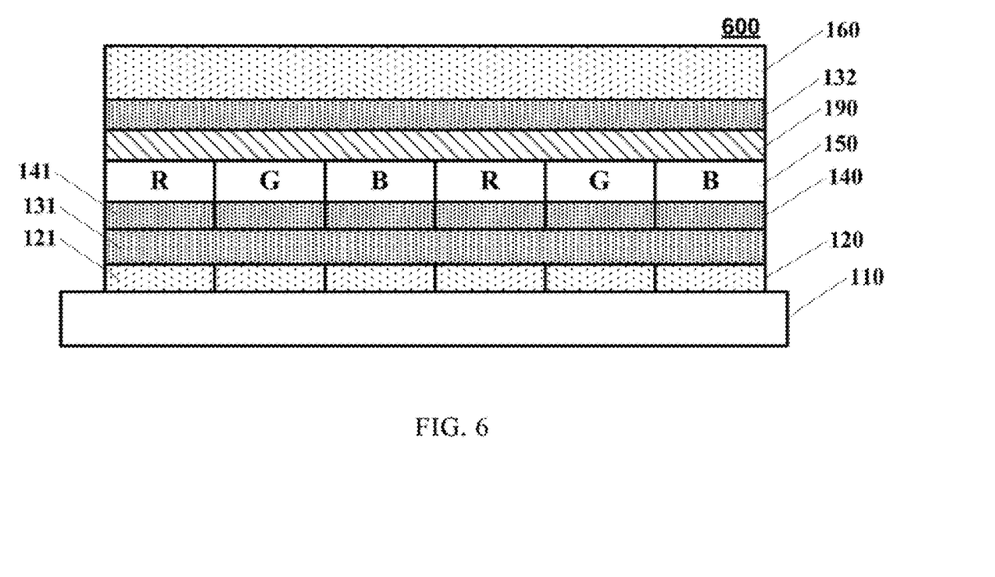
FIG. 6 illustrates a schematic view of another exemplary OLED display panel consistent with disclosed embodiments.

FIG. 6 illustrates a schematic view of another exemplary OLED display panel consistent with disclosed embodiments. The similarities between FIG. 6 and FIG. 2 are not repeated here, while certain differences may be explained. As shown in FIG. 6, different from the OLED display panel 200 in FIG. 2, the OLED display panel 600 in FIG. 6 may further include a hole blocking layer 190.

In particular, the hole blocking layer 190 may be disposed between the plurality of light-emitting devices 150 and the electron transport layer 132. In one embodiment, the absolute value of the highest occupied molecular orbital level (HOMO) of the hole blocking layer 190 may be greater than or equal to approximately 5.8 eV, the triplet energy level of the hole blocking layer 190 may be greater than or equal to approximately 2.4 eV. Further, the absolute value |HOMO| of the highest occupied molecular orbital level of the hole blocking layer 190 may be greater than or equal to approximately 6 eV, and the triplet energy level of the hole blocking layer 190 may be greater than or equal to approximately 2.6 eV.

The hole blocking layer 190 disposed between the electron transport layer 132 and the plurality of light-emitting devices 150 may have a deep HOMO energy level. In one embodiment, the absolute value |HOMO| of the highest occupied molecular orbital level of the hole blocking layer 190 may be greater than or equal to approximately 5.8 eV, or may be greater than or equal to approximately 6 eV. The hole blocking layer 190 may block holes in the light-emitting devices 150 from transporting to the electron transporting layer 132, such that vertical leakage current may be suppressed and the holes may be confined in the light-emitting devices 150, thereby improving exciton recombination efficiency.

The hole blocking layer 190 disposed between the electron transport layer 132 and the plurality of light-emitting devices 150 may also have a substantially high triplet energy level. In one embodiment, the triplet energy level may be greater than or equal to approximately 2.4 eV, and, further, may be greater than or equal to approximately 2.6 eV. The hole-blocking layer 190 may block excitons in the light-emitting device 150 from diffusing into the electron transport layer 132 and confine excitons in the light-emitting device 150, such that the luminous efficiency of the light-emitting devices may be improved.

Figure 7:
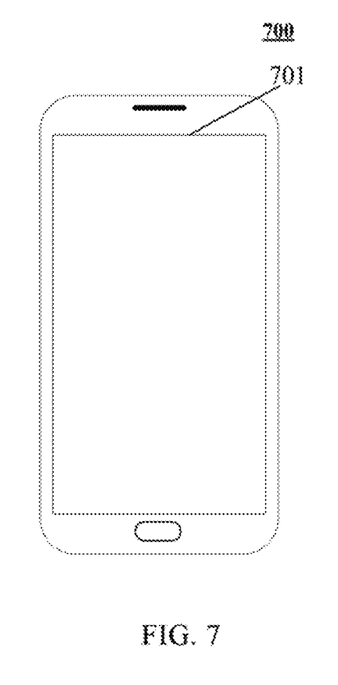
FIG. 7 illustrates a schematic view of an exemplary OLED display device consistent with disclosed embodiments.

The present disclosure also provides an OLED display device. FIG. 7 illustrates a schematic view of an exemplary OLED display device 700 consistent with disclosed embodiments. As shown in FIG. 7, the OLED display device 700 may include any one of the disclosed OLED display panels 701. The disclosed OLED display device 700 may be a cell phone, a tablet, a monitor, and a smart wearable display device, etc. Any OLED display device comprising any one of the disclosed OLED display panels will fall within the scope of the present disclosure. Although a smart phone is shown in FIG. 7, the disclosed OLED display device is not limited to the smart phone.

In one embodiment, the OLED display panel may have a top-emitting structure, in which the light emitted from the light-emitting device passes through the surface on the same side as the second electrode layer. In another embodiment, the OLED display panel may have a bottom-emitting structure, in which the light emitted from the light-emitting device passes through the surface on the same side as the first electrode. In another embodiment, the OLED display panel may have a double-sided light-emitting structure, in which the light emitted from the light-emitting device passes through the surface on the same side as the second electrode layer and the surface on the same side as the first electrode simultaneously.

Those skilled in the art would understand that the film materials and properties may be selected according to various application scenarios. In one embodiment, when the OLED display panel has a top-emitting structure, semi-transparent or transparent conductive materials may be selected for the second electrode layer. In another embodiment, when the OLED display panel has a bottom-emitting structure, the light transmittance of the second electrode layer may not have to be defined.

In one embodiment, the light-emitting devices may include light-emitting materials of different colors. For example, a red light-emitting device may be formed of a red light-emitting material, a green light-emitting material may be formed of a green light-emitting material, and a blue light-emitting device may be formed of a blue light-emitting material.

In another embodiment, the light-emitting device may comprise a white light-emitting element and a color filter film. For example, the red light-emitting device may comprise a white light-emitting element and a red color light filter film which are arranged in layers; the green light-emitting device may comprise a white light-emitting element and a green color light filter film which are arranged in layers; the blue light-emitting device may comprise a white light-emitting element and a blue color filter film arranged in layers.

Further, the light-emitting element and the filter film may be arranged according to the light-emitting structure of the OLED display panel. For example, a color filter film in the top-emitting light-emitting structure may be disposed on the surface of the light-emitting element far away from the first electrode layer.

In the disclosed OLED display panels, the first electrode layer may include a plurality of electrode blocks or a plurality of striped electrodes, and the second electrode layer may be a sheet electrode or include a plurality of striped electrodes. The electrode shapes and structures are for illustrative purposes and are not intended to limit the scope of the present disclosure. The electrode shapes and structures may vary according to various application scenarios.

The disclosed OLED display panel may comprise a first substrate, a first electrode layer including a plurality of first electrodes, a first hole transport layer, a second hole transport layer including a plurality of hole transport units, a plurality of light-emitting devices, an electron transport layer, and a second electrode layer. The plurality of hole transport units may be corresponding to the plurality of first electrodes respectively. The plurality of light-emitting devices may be arranged in correspondence with the plurality of hole transport units. The light-emitting devices may include m number of colors and m may be an integer greater than or equal to 3.

The hole transport units corresponding to the light-emitting devices of at least one color may be formed by mixing at least two hole transport materials, in which the lowest unoccupied molecular orbital (LUMO) of at least one of the at least two hole transport materials may be higher than the lowest unoccupied molecular orbital (LUMO) of the corresponding light-emitting devices. Through providing the hole transport units that are independent from each other, the undesired light emitted by the light-emitting devices adjacent to the turned-on light-emitting device may be suppressed. Accordingly, the crosstalk of the OLED display panels and devices may be reduced, and the performance of the OLED display panels and devices may be improved.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An organic light-emitting diode (OLED) display panel, comprising:
   a first substrate;
   a first electrode layer disposed on the first substrate and including a plurality of first electrodes;
   a first hole transport layer disposed on a surface of the first electrode layer opposing the first substrate;
   a second hole transport layer disposed on a surface of the first hole transport layer opposing the first electrode layer, and including a plurality of hole transport units arranged in correspondence with the plurality of first electrodes respectively;
   a plurality of light-emitting devices of m number of colors disposed on a surface of the second hole transport layer opposing the first hole transport layer and arranged in correspondence with the plurality of hole transport units respectively, wherein m is a positive integer, the hole transport units corresponding to the light-emitting devices of at least one color include at least two hole transport materials, and at least one of the at least two hole transport materials in the hole transport units has a higher lowest unoccupied molecular orbital (LUMO) than the corresponding light-emitting devices;
   an electron transport layer;
   a second electrode layer; and
   a capping layer disposed on a surface of the second electrode layer opposing the electron transport layer, wherein a refractive index of the capping layer is greater than approximately 1.8 at a wavelength of 500 nm.

2. The OLED display panel according to claim 1, wherein:
   m is greater than or equal to 3;
   one light-emitting device corresponds to one color;
   the electron transport layer is disposed on a surface of the plurality of light-emitting devices opposing the second hole transport layer; and
   the second electrode layer is disposed on a surface of the electron transport layer opposing the plurality of light-emitting devices.

3. The OLED display panel according to claim 1, wherein:
   a triplet energy level of at least one of the at least two hole transport materials in the hole transport units is higher than a triplet energy level of the corresponding light-emitting devices.

4. The OLED display panel according to claim 1, wherein:
   a hole transport material of a hole transport unit includes at least one of triphenylamine-containing compounds and carbazole-containing compounds.

5. The OLED display panel according to claim 1, wherein:
   the plurality of light-emitting devices further include a plurality of red light-emitting devices, a plurality of green light-emitting devices, and a plurality of blue light-emitting devices.

6. The OLED display panel according to claim 5, wherein:
   a hole transport unit corresponding to a red light-emitting device has a thickness greater than or equal to approximately 700 Å and smaller than or equal to approximately 1100 Å;
   a hole transport unit corresponding to a green light-emitting device has a thickness greater than or equal to approximately 400 Å and smaller than or equal to approximately 600 Å; and
   a hole transport unit corresponding to a blue light-emitting device has a thickness greater than or equal to approximately 100 Å and smaller than or equal to approximately 300 Å.

7. The OLED display panel according to claim 5, wherein:
   a red light-emitting device is formed by doping at least one first host material with a first guest material, and a mass ratio of the first guest material and the at least one first host material is greater than or equal to approximately 1% and small than or equal to approximately 10%;
   a green light-emitting device is formed by doping at least one second host material with a second guest material, and a mass ratio of the second guest material and the at least one second host material is greater than or equal to approximately 5% and small than or equal to approximately 15%; and
   a blue light-emitting device is formed by doping at least one third host material with a third guest material, and a mass ratio of the third guest material and the at least one third host material is greater than or equal to approximately 1% and small than or equal to approximately 5%.

8. The OLED display panel according to claim 7, wherein:
   both the at least one first host material and the at least one second host material include a carbazole-containing compound;
   both the first guest material and the second guest material include a phosphorescent material;
   the at least one third host material includes an aromatic compound; and
   the third guest material includes a fluorescent material.

9. The OLED display panel according to claim 5, wherein:
a thickness of each of a red light-emitting device and a green light-emitting device is greater than or equal to approximately 200 Å and smaller than or equal to approximately 400 Å;
a thickness of a blue light-emitting device is greater than or equal to approximately 150 Å and smaller than or equal to 350 approximately A.

10. The OLED display panel according to claim 1, wherein:
the first hole transport layer includes at least one composite material layer formed of a hole transport material or a mixture of a plurality of hole transport materials; and
a thickness of the first hole transport layer is greater than or equal to approximately 800 Å and smaller than or equal to approximately 1300 Å.

11. The OLED display panel according to claim 1, wherein:
the electron transport layer includes an electron transport material doped with a metal compound or a metal.

12. The OLED display panel according to claim 11, wherein:
the metal includes at least one of an alkaline earth metal, an alkali metal and a rare earth metal; and
the metal compound includes at least one of an alkaline earth metal compound, an alkali metal compound and a rare earth metal compound.

13. The OLED display panel according to claim 1, wherein:
a thickness of the electron transport layer is greater than or equal to approximately 250 Å and smaller than or equal to approximately 350 Å.

14. The OLED display panel according to claim 1, wherein the first electrode layer further includes at least:
a reflective film disposed on the first substrate and including a silver; and
a transparent conductive film disposed on a surface of the reflective film opposing the first substrate, and including indium tin oxide or indium zinc oxide.

15. The OLED display panel according to claim 1, wherein:
the second electrode layer includes at least one of a magnesium-silver alloy, a silver metal, a silver-ytterbium alloy, and a silver-rare earth metal alloy; and
a transmittance of the second electrode layer at a wavelength of 550 nm is greater than or equal to approximately 30% and smaller than or equal to approximately 60%.

16. The OLED display panel according to claim 1, further comprising:
a buffer layer disposed between the first electrode layer and the first hole transport layer, wherein:
the buffer layer includes a hole transport material doped with a p-type dopant, and a mass ratio of the p-type dopant to the hole transport material is greater than or equal to approximately 0.5% and smaller than or equal to approximately 10%; and
a thickness of the buffer layer is greater than or equal to approximately 50 Å and smaller than or equal to approximately 100 Å.

17. The OLED display panel according to claim 1, wherein:
a thickness of the capping layer is greater than or equal to approximately 500 Å and smaller than or equal to approximately 800 Å.

18. The OLED display panel according to claim 1, further comprising:
a hole blocking layer disposed between the plurality of light-emitting devices and the electron transport layer,
wherein an absolute value |HOMO| of a highest occupied molecular orbital level of the hole blocking layer is greater than or equal to approximately 5.8 eV, and
a triplet energy level of the hole blocking layer is greater than or equal to approximately 2.4 eV.

19. The OLED display panel according to claim 18, wherein:
the absolute value |HOMO| of the highest occupied molecular orbital level of the hole blocking layer is greater than or equal to approximately 6 eV; and
the triplet energy level of the hole blocking layer is greater than or equal to approximately 2.6 eV.

20. An organic light-emitting diode (OLED) display device, comprising the OLED display panel according to claim 1.

* * * * *